(12) United States Patent
Holmgren et al.

(10) Patent No.: US 10,537,965 B2
(45) Date of Patent: Jan. 21, 2020

(54) FIBER ARRAY LINE GENERATOR

(71) Applicant: Applied Materials, Inc., Santa Clara, CA (US)

(72) Inventors: Douglas E. Holmgren, Portland, OR (US); Samuel C. Howells, Portland, OR (US); Aaron Muir Hunter, Santa Cruz, CA (US); Theodore P. Moffitt, Hillsboro, OR (US); Diwakar N. Kedlaya, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 1077 days.

(21) Appl. No.: 14/172,422

(22) Filed: Feb. 4, 2014

(65) Prior Publication Data
US 2015/0165551 A1    Jun. 18, 2015

Related U.S. Application Data

(60) Provisional application No. 61/915,972, filed on Dec. 13, 2013.

(51) Int. Cl.
*B23K 26/06* (2014.01)
*H01L 21/67* (2006.01)

(52) U.S. Cl.
CPC .... *B23K 26/0648* (2013.01); *H01L 21/67115* (2013.01)

(58) Field of Classification Search
CPC ............ H01R 13/5812; H01R 13/6275; H01L 21/67115; B23K 26/0608; B23K 26/0648; B23K 26/0738

USPC .............................. 219/121.75; 438/487, 795
See application file for complete search history.

(56) References Cited

U.S. PATENT DOCUMENTS

| | | | |
|---|---|---|---|
| 4,820,010 A | 4/1989 | Scifres et al. | |
| 5,619,245 A | 4/1997 | Kessler et al. | |
| 6,278,078 B1 * | 8/2001 | Walvoord | B23K 1/0056 219/121.61 |

(Continued)

FOREIGN PATENT DOCUMENTS

| | | |
|---|---|---|
| CN | 1925109 A | 3/2007 |
| CN | 101052922 A | 10/2007 |

(Continued)

OTHER PUBLICATIONS

International Search Report and Written Opinion for International Application No. PCT/US2014/067431 dated Feb. 27, 2015.

(Continued)

*Primary Examiner* — Tu B Hoang
*Assistant Examiner* — Diallo I Duniver
(74) *Attorney, Agent, or Firm* — Patterson + Sheridan LLP

(57) ABSTRACT

Embodiments described herein relate to the rapid thermal processing of substrates. A fiber coupled laser diode array is provided in an optical system configured to generate a uniform irradiance pattern on the surface of a substrate. A plurality of individually controllable laser diodes are optically coupled via a plurality of fibers to one or more lenses. The fiber coupled laser diode array generates a Gaussian radiation profile which is defocused by the lenses to generate a uniform intensity image. In one embodiment, a field stop is disposed within the optical system.

14 Claims, 10 Drawing Sheets

(56) References Cited

U.S. PATENT DOCUMENTS

| | | | |
|---|---|---|---|
| 6,366,709 B1* | 4/2002 | Shekel | B41J 2/451 385/8 |
| 6,608,665 B1* | 8/2003 | Nishi | G03F 7/70066 355/53 |
| 6,847,761 B2* | 1/2005 | Hamanaka | G02B 6/29307 359/19 |
| 7,058,275 B2 | 6/2006 | Sezerman et al. | |
| 2002/0031298 A1* | 3/2002 | Hamada | G02B 26/123 385/31 |
| 2002/0110328 A1 | 8/2002 | Bischel et al. | |
| 2003/0210861 A1* | 11/2003 | Weiss | B41J 2/45 385/33 |
| 2003/0218805 A1* | 11/2003 | Yamakawa | G02B 3/06 359/668 |
| 2004/0190573 A1 | 9/2004 | Kruschwitz et al. | |
| 2005/0045604 A1* | 3/2005 | Talwar | B23K 26/0604 219/121.65 |
| 2005/0063435 A1* | 3/2005 | Imai | G02B 27/0955 372/43.01 |
| 2006/0244956 A1* | 11/2006 | Furman | G01N 21/8806 356/237.4 |
| 2007/0054443 A1* | 3/2007 | Shimomura | B23K 26/067 438/149 |
| 2007/0229939 A1 | 10/2007 | Brown et al. | |
| 2007/0284516 A1* | 12/2007 | Bustamante | G02B 21/32 250/251 |
| 2007/0296936 A1* | 12/2007 | Kato | G03F 7/70275 355/52 |
| 2011/0090462 A1 | 4/2011 | Endo et al. | |
| 2013/0025325 A1 | 1/2013 | Piwczyk et al. | |
| 2013/0112667 A1 | 5/2013 | Holmgren et al. | |

FOREIGN PATENT DOCUMENTS

| | | | |
|---|---|---|---|
| CN | 101465513 | A | 6/2009 |
| CN | 201478685 | U | 5/2010 |
| CN | 103155308 | A | 6/2013 |
| JP | 2001324690 | | 2/2001 |
| JP | 2001255491 | A * | 9/2001 |
| JP | 2002050813 | A | 2/2002 |
| JP | 2004-273620 | A | 1/2004 |
| JP | 2004304186 | A | 10/2004 |
| JP | 2006-186243 | A | 1/2006 |
| TW | 457158 | B | 10/2001 |
| TW | 200417100 | A | 9/2004 |
| TW | 200503444 | A | 1/2005 |

OTHER PUBLICATIONS

Search Report for Taiwan Application No. 103141466 dated Feb. 22, 2018.
Chinese Application No. 201480067786.7, Office Action and Search Report dated Jun. 28, 2018, 20 pages.
Chinese Office Action dated Sep. 3, 2018 for Application No. 201710626101.3.
Office Action for Chinese Application No. 201710626101.3 dated Mar. 29, 2019.
Search Report for Chinese Application No. 201710626101.3 dated Mar. 21, 2019.
Office Action for Chinese Application No. 201480067786.7 dated Jun. 4, 2019.
Search Report for Chinese Application No. 201480067786.7 dated May 28, 2019.
Office Action for Taiwan Application No. 107142836 (APPM/021444TW01DIV) dated Sep. 19, 2019.

* cited by examiner

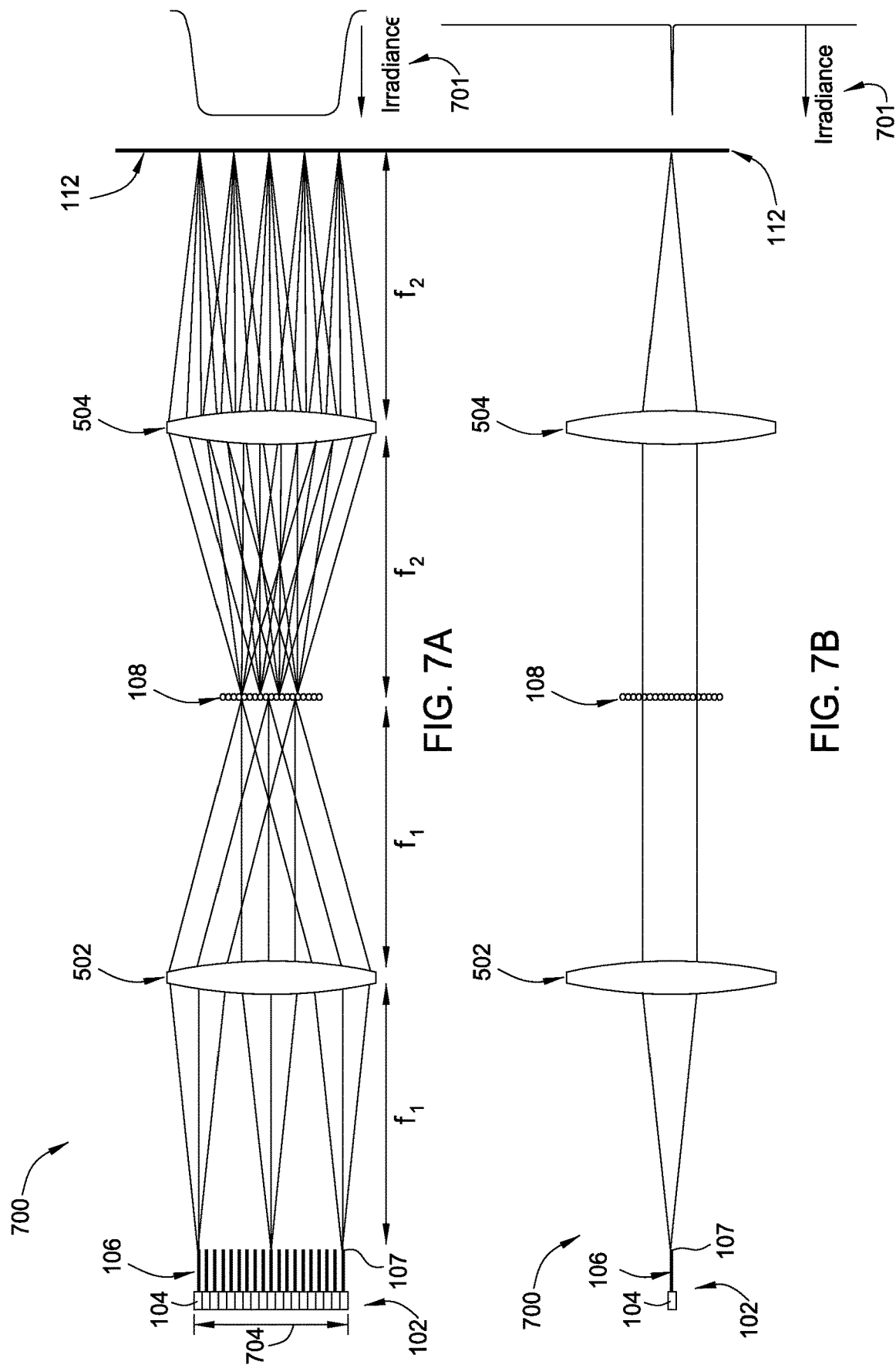

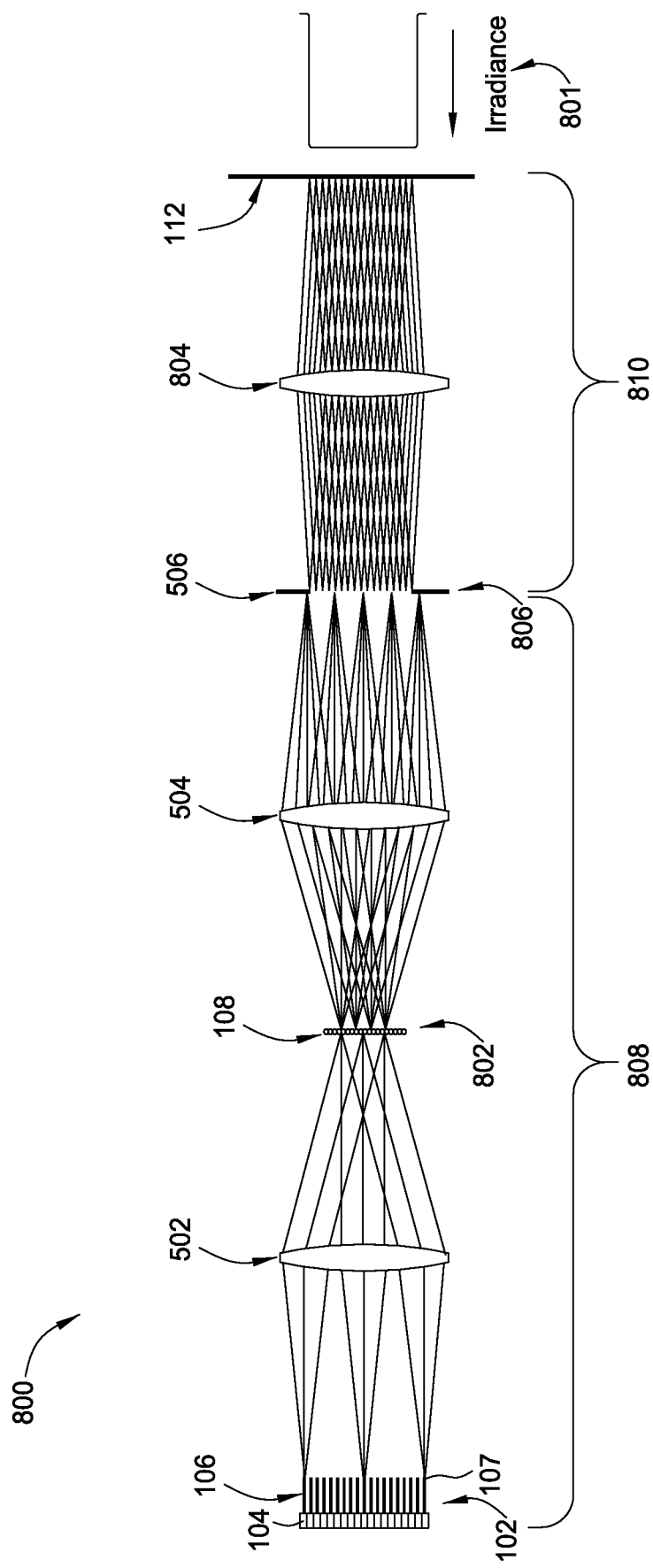

FIBER ARRAY LINE GENERATOR

CROSS-REFERENCE TO RELATED APPLICATIONS

This application claims benefit of U.S. provisional patent application No. 61/915,972, filed Dec. 13, 2013, which is hereby incorporated by reference.

FIELD

Embodiments provided herein relate to an apparatus for thermally processing substrates. More specifically, embodiments provided herein relate to a fiber array line generator.

BACKGROUND

Lasers are often utilized in the processing of semiconductor substrates. Thermal processing, such as rapid thermal processing, is utilized to process substrates by changing the characteristics of the substrate being processes. The thermal processing may alter the physical structure of the substrate, implant dopants into the substrate, or melting a portion of the substrate.

Laser diodes are one example of a laser source for thermal processing. These lasers suffer from several disadvantages by requiring complicated cooling systems and a tendency to occasionally catastrophically fail. The failure of laser diodes, especially laser diode bars which are generally a plurality of laser diodes in series with one another, requires costly and time consuming maintenance. Additionally, the throughput of the thermal processing system is negatively affected when laser diodes fail. Moreover, conventional laser diodes must be utilized near or within a thermal processing chamber. The failure of the laser diodes with such proximity to the processing equipment can increase the probability of damage to other semiconductor processing components.

Another consideration in laser thermal processing is the ability of the laser source and associated optics to provide a desirable radiation profile to the substrate being processed. However, conventional laser diodes suffer from performance degradation over the useful lifetime of the laser diode. The decrease in performance often negatively affects the radiation profile and reduces the ability of the thermal processing system to effectively process the substrate in a desirable manner.

Therefore, there is a need in the art for a laser thermal processing apparatus which provides improved thermal processing characteristics. Additionally, there is a need for laser diode systems which are more easily maintained.

SUMMARY

Embodiments described herein relate to the rapid thermal processing of substrates. Fiber coupled laser diodes are provided in an optical system configured to generate a uniform irradiance pattern on the surface of a substrate. A plurality of individually controllable laser diodes are optically coupled via a plurality of fibers to one or more lenses. The fiber coupled laser diodes generate a Gaussian radiation profile which is defocused by the lenses to generate a uniform intensity image. A field stop may be disposed within the optical system.

In one embodiment, an apparatus for processing a substrate is provided. The apparatus comprises a plurality of fiber coupled laser diodes. Each fiber coupled laser diode of the plurality has one or more laser diodes and a fiber optically coupled to the laser diodes. A first lens is disposed proximate to a distal end of the fiber coupled laser diodes. A second lens is disposed proximate the first lens. The first lens and the second lens comprise an anomorphic optical imaging system.

In another embodiment, an apparatus for processing a substrate is provided. The apparatus comprises a plurality of fiber coupled laser diodes. Each fiber coupled laser diode of the plurality has a laser diode and a fiber optically coupled to the laser diode. A first lens is disposed proximate a distal end of the fiber coupled laser diodes. A second lens is disposed proximate the first lens and a field stop is disposed proximate the second lens. A third lens is disposed proximate the field stop. The first lens, second lens, and third lens comprise an anomorphic optical imaging system.

In yet another embodiment, an apparatus for processing a substrate is provided. The apparatus comprises a plurality of fiber coupled laser diodes having a numerical aperture of about 0.15. Each fiber coupled laser diode of the plurality has an individually controllable laser diode and a fiber optically coupled to the laser diode. A distal end of each of the fibers is spaced about 0.5 mm from each adjacent fiber. The fibers are disposed within a single plane. A cylindrical microlens array is disposed between an image plane and the distal end of the fiber coupled laser diodes. The image plane is located between about 5 mm and about 6 mm from the distal end of the fiber coupled laser diodes. A telecentric imaging lens is disposed proximate the cylindrical microlens array. The cylindrical microlens array and the telecentric imaging lens comprise an anomorphic optical imaging system.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIG. 7A is a schematic, plan view of a thermal processing apparatus according to an embodiment described herein.

FIG. 7B is a schematic, side view of the apparatus of FIG. 7A according to an embodiment described herein.

FIG. 8 is a schematic, plan view of a thermal processing apparatus according to an embodiment described herein.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Figure 1A:
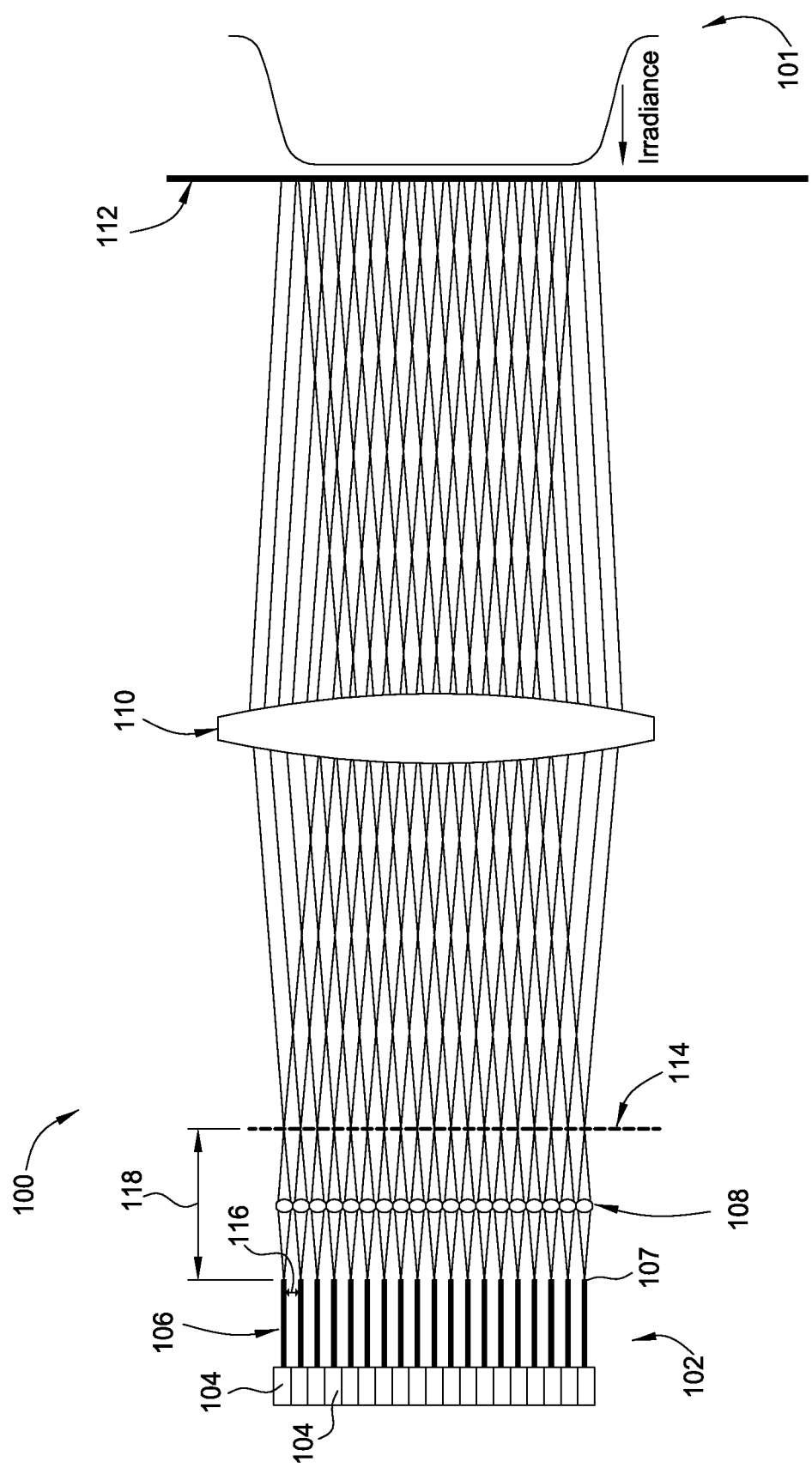
FIG. 1A is a schematic, plan view of a thermal processing apparatus according to an embodiment described herein.

Embodiments described herein relate to the rapid thermal processing of substrates. Fiber coupled laser diodes are provided in an optical system configured to generate a uniform irradiance pattern on the surface of a substrate. Utilizing high power fiber coupled laser diodes as sources of light in combination with optics may produce a focused line of light of high peak intensity. For example, a plurality of individually controllable laser diodes are optically coupled via a plurality of fibers to one or more lenses. The fiber coupled laser diodes generate a Gaussian radiation profile, which is defocused by the lenses, to generate a uniform intensity image. In one embodiment, a field stop is disposed within the optical system.

The term "anomorphic" as utilized herein refers to an optical system which has different imaging properties in the direction along the array and perpendicular to the array. For convenience, terminology commonly associated with diode lasers to denote the direction axes at a fiber array and image plane will be utilized. The slow axis ("SA") is defined as the direction parallel to the line which passes through all distal ends of the fibers in the fiber array. The SA is also parallel to the line of light formed by the optics described hereinafter. The fast axis ("FA") is perpendicular to the SA.

Conventional fiber array systems, utilizing fiber coupled laser diodes and optical systems, often image the distal ends of the fibers on the substrate. The image contains high intensity discrete "spots" and lacks uniformity in intensity across a line image. Creating a uniform line of radiation may be accomplished by utilizing anomorphic optics to blur the spot images. The blurring of the spot images in the SA is accomplished by designing the optics to produce a defocused field at the work surface in the SA direction. The amount of spot blurring obtained for a given defocus is determined by the divergence of the light produced by the optics. A greater amount of divergence generally provides a larger blur for a given defocus.

The output of a typical optical fiber utilized with high power laser diodes is nearly Gaussian sufficiently far from the distal end of the fiber and has a numerical aperture (NA) of between about 0.1 and about 0.4. For embodiments described below, we assume an exemplary NA is 0.15, but fibers having a different NA may be utilized. The Gaussian distribution in the embodiments described below is spread out in the SA but narrow in the FA due to the anomorphic optics utilized to form the uniform line image.

FIG. 1 is a schematic, plan view of a thermal processing apparatus 100 according to one embodiment. The apparatus 100 comprises fiber coupled laser diodes 102, a cylindrical microlens array 108, and an imaging lens 110. The apparatus 100 comprises an anomorphic imaging optical system. An imaging optic, such as an imaging lens, as used herein, refers to an optic which takes an object and reconstructs an image of the object. The image may be similar to the object or may be distorted. A reimaging optic, or reimaging lens, as used herein, refers to an optic which takes an image and relays the image beyond the reimaging optic. A work surface 112 is spaced proximate the imaging lens 110 at a location configured to receive a desired line image. The fiber coupled laser diodes 102, cylindrical microlens array 108, and imaging lens 110 may be coupled to a gantry configured to move the aforementioned elements relative to the work surface 112. The location of the work surface 112 may be within a processing chamber (not shown), generally on a stage, and a substrate to be thermally processed is disposed on the work surface 112. The line image at the work surface 112 has a uniform irradiance profile 101 which exhibits a Gaussian or half-Gaussian roll-off profile. Here, uniform irradiance is defined as maximum intensity variation of not more than about 10% from an average value.

The fiber coupled laser diodes 102 comprise a laser diode 104 and a fiber 106 optically coupled to the laser diode 104. For example, each laser diode 104 may be coupled to an individual fiber 106. As illustrated in FIG. 1, nineteen fiber coupled laser diodes are provided in an array, however, it is contemplated that a greater number or lesser number of fiber coupled laser diodes may be utilized depending upon the desired application. In one embodiment, multiple laser diodes 104 may be coupled into a single fiber 106. Each laser diode 104 is configured to provide about 100 W of power at a distal end 107 of its respective fiber 106. The individual laser diodes 104 may be individually controllable and may operate independently from adjacent fiber coupled laser diodes 102. Independent operation of the laser diodes 104 allows for improved process tuning and simplified replacement of the laser diode 104 when the laser diode 104 fails. Although the laser diodes 104 are operated independently, the fiber coupled laser diodes 102 work together to generate a line image having a uniform irradiance profile 101.

The fibers 106 enable the laser diodes 104 to be located outside, and be spaced from, the processing chamber where the thermal processing is being performed. For example, the fibers 106 may be up to several meters long. Each fiber 106 at the distal end 107 may have a pitch 116, or distance, between about 0.1 mm and about 1.0 mm, such as about 0.5 mm. An output diameter of the distal end 107 of the fibers 106 is between about 50 um and about 150 um, such as about 100 um. The distal ends 107 of the fibers 106 may be positioned to lie in the same plane to within about 20 um or less. At least a portion of the fibers 106 is disposed within a positioning element (not shown) which is described in greater detail with regard to FIG. 2.

The cylindrical microlens array 108 is disposed proximate the distal end 107 of the fibers 106. Light exiting the distal end 107 of the fibers 106 propagates through the cylindrical microlens array 108. The cylindrical microlens array 108 is an anomorphic component that defocuses the light propagating from the individual fibers 106. The cylindrical microlens array 108 may be aligned to the fiber coupled laser diode array such that the light from each fiber 106 is incident on a single cylindrical lens of the microlens array 108. For example, if 19 fibers 106 are provided, nineteen cylindrical lenses could be provided, a single lens optically coupled to each fiber 106. As such, the pitch between each cylindrical lens correlates and may be equal to the pitch between the distal ends 107 of the fibers 106. Each cylindrical lens may have optical power only in the SA direction. Each cylindrical lens causes the spot formed by its corresponding fiber 106 to blur due to defocus in the SA direction (direction parallel to the array). The overlapping of the defocused spots produces a line image having the uniform irradiance profile 101 at the work surface 112.

The cylindrical microlens array 108 defocuses the distal ends 107 of the fibers 106 onto a focus plane 114. The cylindrical microlens array 108 shapes the radiation into a field to be reproduced on the work surface 112. The field to be reproduced is formed at a selected plane spaced a distance 118 between about 5 mm and about 6 mm, such as about 5.5 mm, from the distal ends 107 of the fibers 106. The imaging lens 110 is disposed proximate the focus plane 114. The focus plane 114 is not re-imaged to the work surface 112 because the imaging lens 110 is focused for the distal ends 107 of the fibers 106. Thus, the imaging lens 110 images the fibers 106, which have been defocused by the cylindrical microlens array 108, to the work surface 112.

Figure 1B:
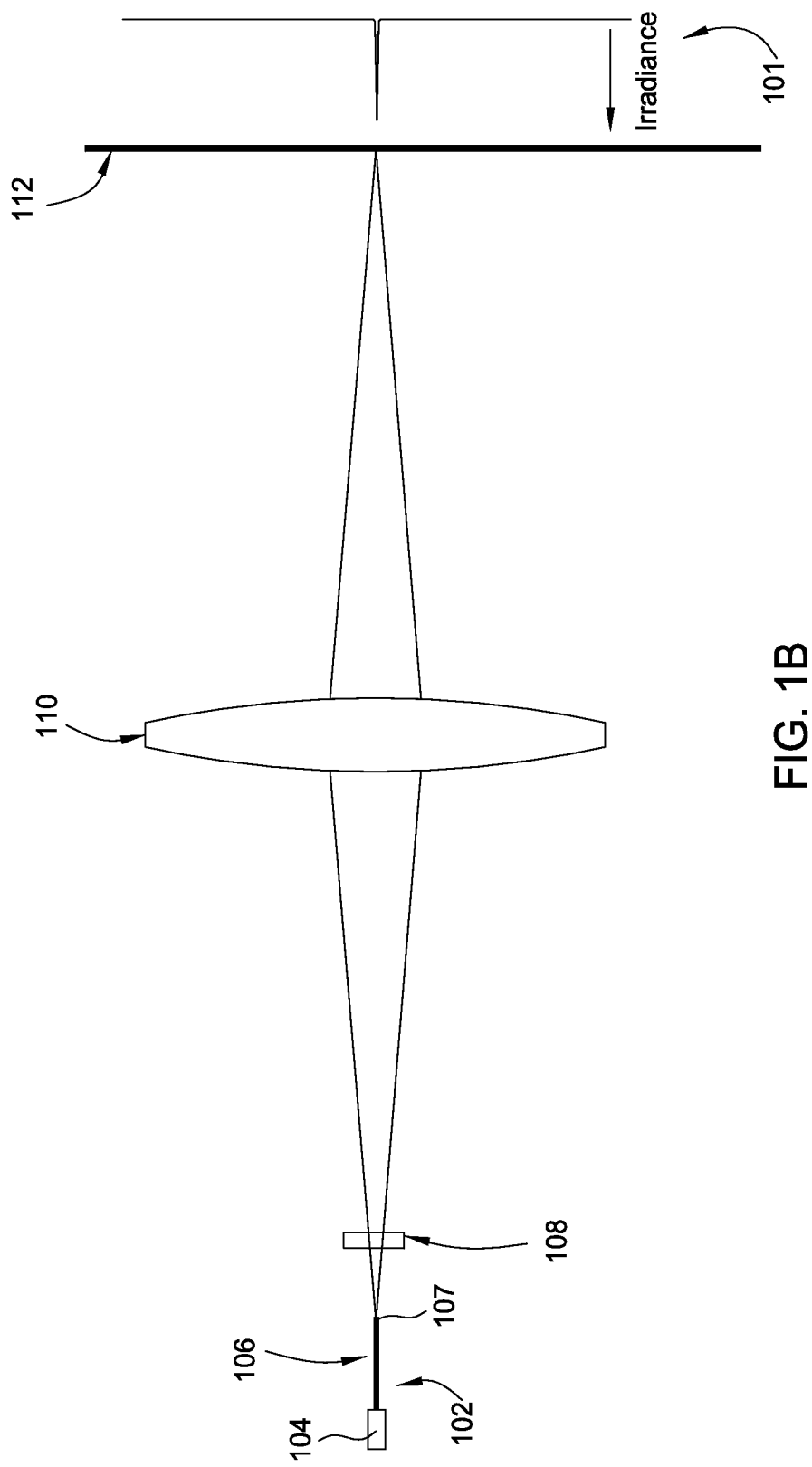
FIG. 1B is a schematic, side view of the apparatus of FIG. 1A according to an embodiment described herein.

FIG. 1B is a schematic, side view of the thermal processing apparatus 100 of FIG. 1A. FIG. 1B depicts the propagation of the laser energy in the FA direction, i.e., perpendicular to the fiber array. In the FA direction, the distal ends 107 of the fibers 106 are re-imaged, or reproduced, on the work surface 112. As such, the cylindrical microlens array 108 has no defocusing affect in the FA direction.

Figure 2A:
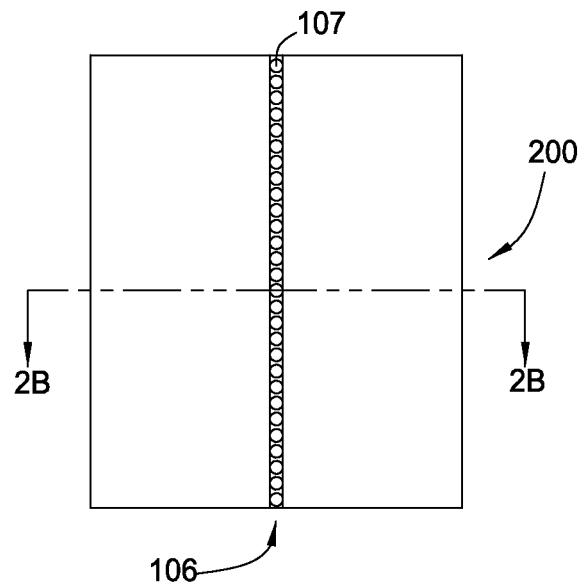
FIG. 2A is a plan view of a v-groove positioning element according to an embodiment described herein.

FIG. 2A is a plan view of a v-groove positioning element 200. The positioning element 200 is configured to provide structure to the distal ends 107 of the fibers 106. The positioning element 200 may be formed from a heat stable material, such as a refractory metal or a ceramic material, capable of withstanding temperatures utilized in rapid thermal processing.

Figure 2B:
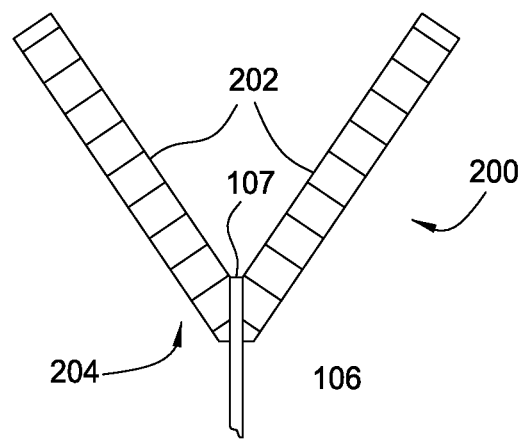
FIG. 2B is a cross-sectional view of the element of FIG. 2A according to an embodiment described herein.

FIG. 2B is a cross-sectional view of the positioning element 200 of FIG. 2A. The positioning element 200 has a profile that is V-shaped. Waveguide members 202 extend from a base region 204 in an opposing manner to form the V-shape. The base region 204 is configured to couple the fibers 106 and position the distal ends 107. The distal ends 107 of each fiber 106 may be located within the same plane. For example, the distal ends 107 may be positioned within +/− about 20 um from a datum plane. In one embodiment, the positioning element 200 is configured to position between about 1 and about 100 fibers 106, such as between about 5 and about 50 fibers 106, for example, between about 10 and about 20 fibers 106.

Figure 2C:
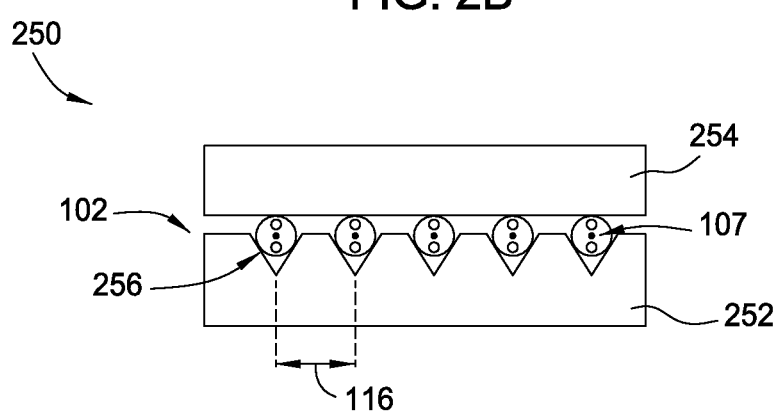
FIG. 2C is a side view of a v-groove positioning element according to an embodiment described herein.

FIG. 2C is a side view of a v-groove positioning element 250. The positioning element 250 may function similarly to the positioning element 200 in that the positioning element 250 provides structure to the distal ends 107 of the fiber coupled laser diodes 102. The positioning element 250 comprises a first body 252 and a second body 254. The first body 252 has one or more v-grooves 256 formed therein. The v-grooves 256 are configured to position the distal ends 107 of the fiber coupled laser diodes 102. The v-grooves may be reflective and serve as a waveguide to radiation being emitted from the distal ends 107. Spacing between adjacent v-grooves 256 may be configured to match the pitch 116 between adjacent distal ends 107. The distal ends 107 may be disposed within the v-grooves 256. The second body 254 is disposed adjacent the first body 252 and configured to secure the distal ends 107 within the v-grooves 256. An example of a suitable positioning element 250 is available from OZ Optics, Ottawa, ON, Canada, which is described in greater detail in U.S. Pat. No. 7,058,275.

Generally, a single positioning element may be used to position all fibers in a thermal processing apparatus, or multiple positioning elements may be used to position fibers individually, or in groups. Use of multiple positioning elements allows for positioning fibers at different distances from the work surface (or the optical system between the work surface and the fibers). Positioning the fibers at different distances from the work surface may have benefits in reducing correlation of laser radiation at the work surface in some embodiments.

Figure 3A:
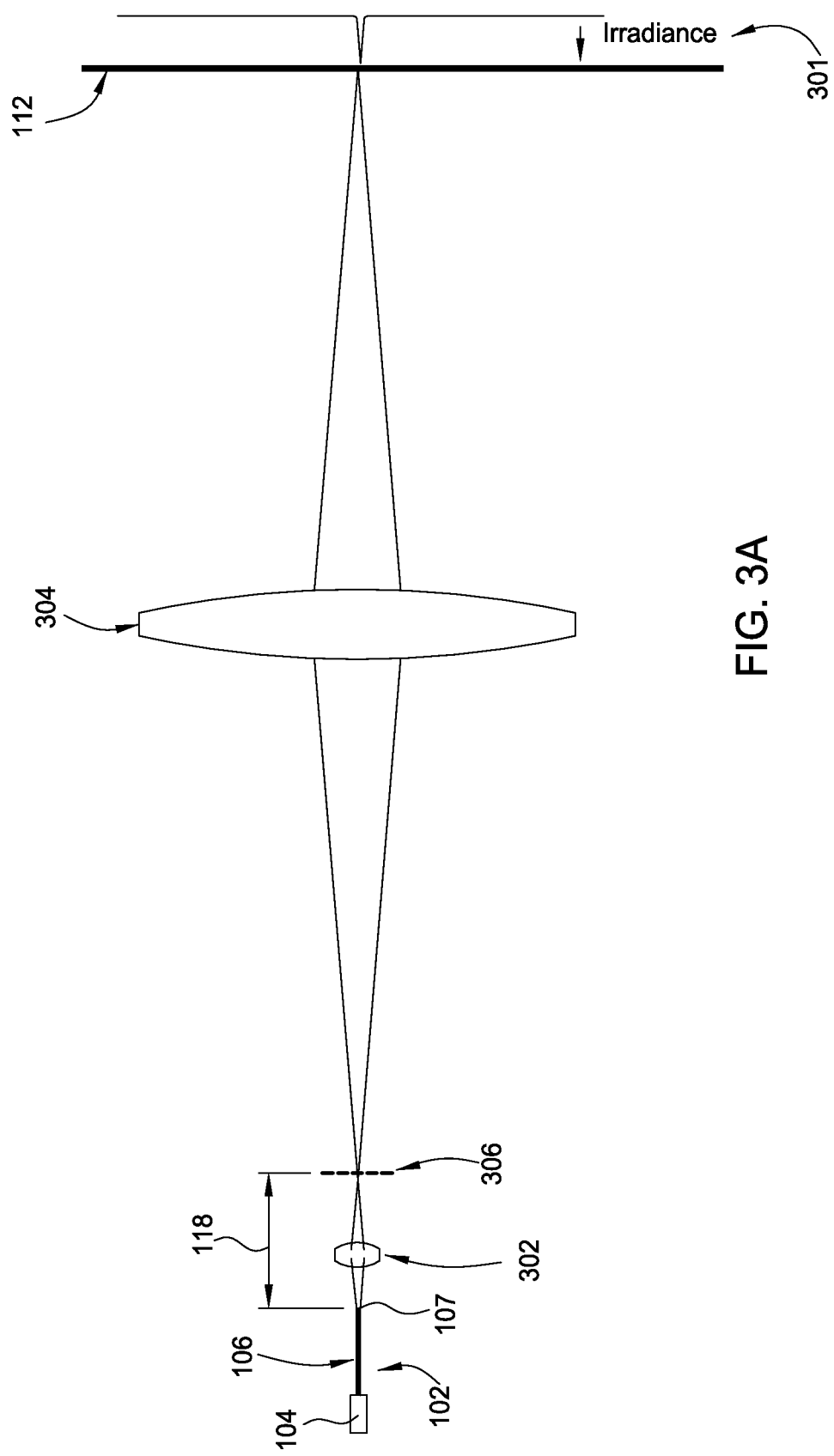
FIG. 3A is a schematic, side view of a thermal processing apparatus according to an embodiment described herein.
Figure 3B:
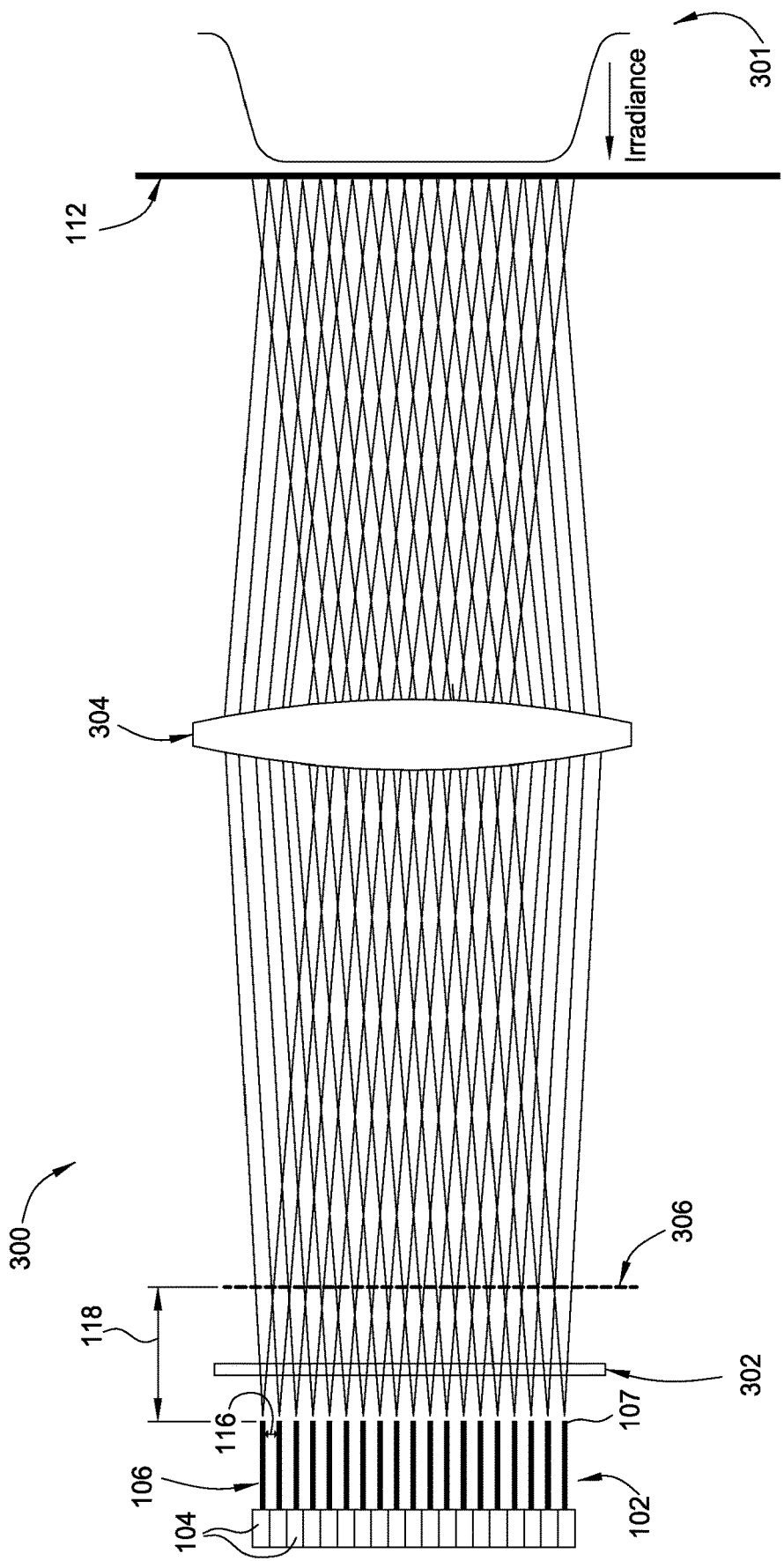
FIG. 3B is a schematic, plan view of the apparatus of FIG. 3A according to an embodiment described herein.

FIGS. 3A-B illustrate schematic, side and plan views, respectively, of a thermal processing apparatus 300. In FIG. 3A, the cylindrical microlens array 108 of FIG. 1A is replaced by a single cylindrical lens 302 having its axis parallel to the SA direction. The cylindrical lens 302 is disposed proximate the distal ends 107 of the fibers 106 in the same location as the microlens array 108 of FIG. 1A. The use of the cylindrical lens 302 makes the optical system anomorphic.

The cylindrical lens 302 reimages the laser coupled fiber diode array 102 in the FA direction at an image plane 306 located a desired distance from the distal ends 107 of the fibers 106. The image plane 306 is formed a distance 118 from the distal ends 107 of the fibers 106 between about 5 mm and about 6 mm, such as about 5.5 mm. In the image plane 306 of the cylindrical lens 302, the beams propagating from each fiber 106 overlap in the SA direction and result in a desirable line image with sufficient blurring. In one embodiment, the work surface 112 may be located at the image plane 306.

In another embodiment, the work surface 112 is located further from the cylindrical lens 302. Utilizing a reimaging lens 304 enables the work surface 112 to be located beyond the image plane 306, which provides for a convenient working distance within the apparatus 300. The reimaging lens 304 is disposed proximate the cylindrical lens 302 and between the image plane 306 and the work surface 112. The reimaging lens 304 is configured to reimage the line at the image plane 306 onto the work surface 112. The reimaging lens 304 may be a single lens or a multi-element lens. In one embodiment, the reimaging lens 304 is a multi-element lens, which is described in greater detail with regard to FIG. 6.

FIG. 3B illustrates the SA view of the apparatus 300. In the embodiments depicted in FIGS. 3A-B, the line image formed by the cylindrical lens 302 may be considered an intermediate image, which is subsequently reimaged by the imaging lens 304 onto the work surface. In this embodiment, the cylindrical lens 302 has no affect in the SA direction. However, reimaging the line image at the image plane 306 provides for a uniform irradiance profile 301 at the work surface. In this embodiment, the edge roll-off of the irradiance profile is Gaussian or half-Gaussian.

Figure 4:
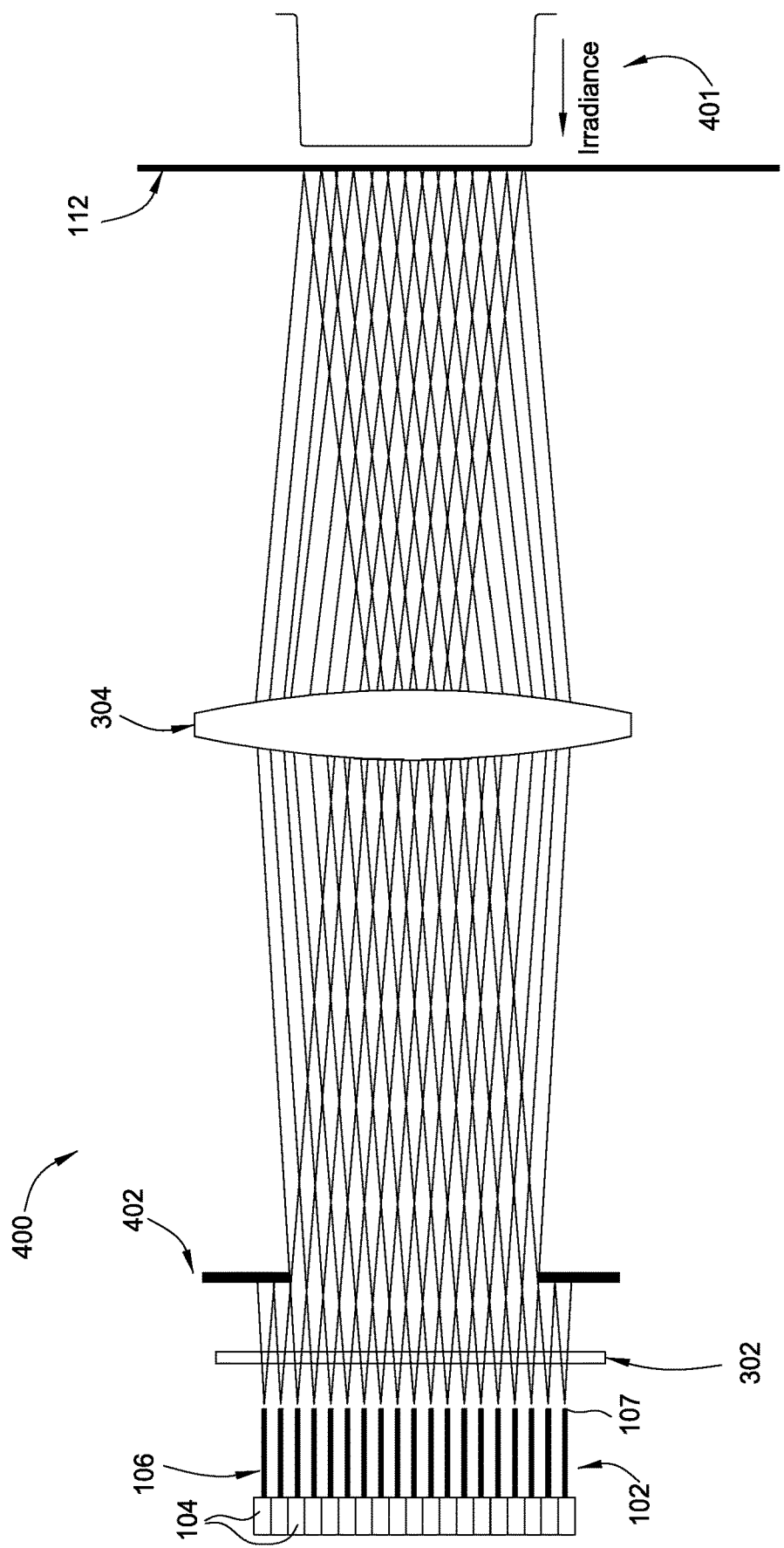
FIG. 4 is a schematic, plan view of the thermal processing apparatus of FIGS. 3A-3B having a field stop disposed therein according to an embodiment described herein.

FIG. 4 is a schematic, plan view of the thermal processing apparatus 300 of FIG. 3B having a field stop 402 disposed therein. The field stop 402 may be disposed at the image plane 306 (See FIG. 3B) and configured to truncate a portion of the line image. For example, a portion of the entire line image at the distal ends 107 of the fibers 106 will propagate to the work surface 112 when the field stop 402 is present in the apparatus 300. The field stop 402 includes an opaque, heat stable material, such as certain refractory metals or ceramic materials, which is capable of withstanding the elevated temperatures associated with rapid thermal processing. The field stop 402 may be ring-shaped having an aperture selected to relay a desired portion of the line image to the work surface 112. In another embodiment, the field stop 402 may be a slit-like apparatus wherein the aperture is configured to allow propagation of a desired portion of the line image therethrough. The field stop 402 may be adjustable and may be moved within the apparatus 400. For example, by adjusting the position of the field stop 402 toward or away from the array of fiber coupled laser diodes 102, the edge decay of the irradiance profile may be adjusted. Thus, a continuum of edge decay profiles between fast decay and slow decay may be achieved.

Surfaces of the field stop 402 may be roughened or coated with various materials to reflect or absorb light incident on the field stop 402. For example, a surface of the field stop 402 facing the reimaging lens 304 may be coated with a reflective material to reflect any light reflected from the work surface 112 away from the line image being formed through the field stop 402. In another embodiment, the surfaces of the field stop 402 may be coated with a dielectric material selected to absorb light of a certain wavelength and the material may be matched to absorb light having the same wavelength as the laser source.

The irradiance profile 401 at the work surface 112 with the field stop 412 exhibits a reduced edge roll-off due to the truncation of the line image by the field stop 402. For example, the line end profile at the work surface 112 makes the transition from maximum irradiance to zero irradiance over a distance of less than about 10 um (as determined by the resolution of the reimaging lens 304). Thus, the edge roll-off of the irradiance profile 401 is very steep and non-Gaussian. The sharp edge of the line image at the work surface 112 enables better control and more precision while performing rapid thermal processing.

Figure 5:
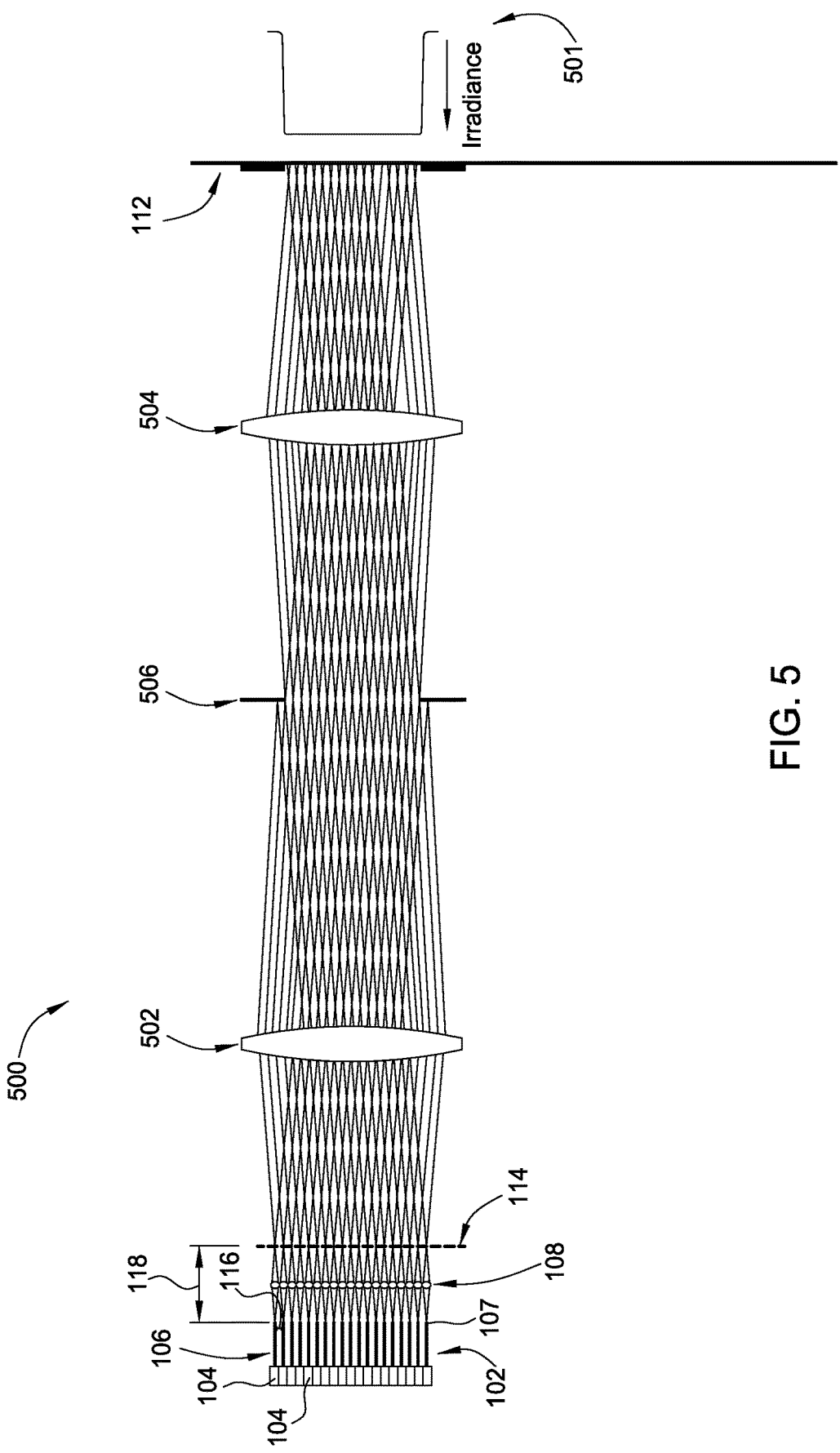
FIG. 5 is a schematic, plan view of a thermal processing apparatus according to an embodiment described herein.

FIG. 5 is a schematic, plan view of a thermal processing apparatus 500. The apparatus 500 comprises the fiber coupled laser diode array 102, the cylindrical microlens array 108, an imaging lens 502, a reimaging lens 504, and a field stop 506. A first portion 510 of the apparatus 500 is similar to the apparatus 100 illustrated in FIG. 1. The imaging lens 502 images the fiber coupled laser diode array 102 in the FA direction, however, the imaging lens 502 does not image in the SA direction. The field stop 506 is similar to the field stop 402 described with regard to FIG. 4. The field stop 506 is disposed proximate the imaging lens 502 where the line image is formed. In the first portion 510, the field stop 506 is disposed where the work surface would normally be if the reimaging lens 504 was not being utilized. Thus, the line image at the field stop 506 will be translated through the reimaging lens 504 to the work surface 112.

The reimaging lens 504 is disposed proximate the field stop 506 in a second portion 520 of the apparatus 500. The second portion 520 includes the region beyond the field stop 506, encompassing the reimaging lens 504 and the work surface 112. The reimaging lens 504 relays the line image formed by the field stop 506 to the work surface 112. The reimaging lens 504 does not defocus in either the SA direction or the FA direction, rather, the reimaging lens simply reproduces the light, arranged by the field stop 506, on the work surface 112.

The apparatus 500 creates an irradiance profile 501 at the work surface 112 having a reduced edge roll-off due to the truncation of the line image by the field stop 506. Similar to the irradiance profile 401 of FIG. 4, the line end profile at the work surface 112 makes the transition from maximum irradiance to zero irradiance over a distance of less than about 10 um (as determined by the resolution of the reimaging lens 504). Thus, the edge roll-off of the irradiance profile 501 is very steep and non-Gaussian.

Figure 6:
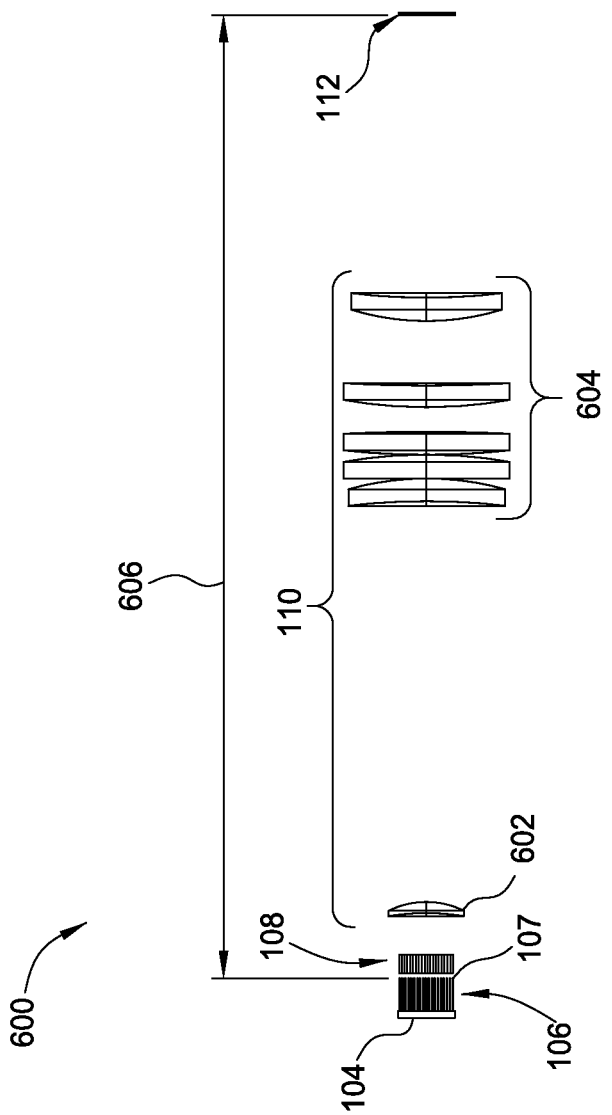
FIG. 6 is a schematic view of an optical system according to an embodiment described herein.

FIG. 6 is a schematic view of an optical system 600 which may be incorporated into the aforementioned embodiments. In order to achieve the necessary imaging fidelity for reimaging the FA direction fiber coupled laser diode array 102 to the work surface 112, the imaging lens 110, (also 304, 502) of FIG. 1, (also FIGS. 3 and 5, respectively) is a multi-element lens with the necessary minimum aberrations. In one embodiment, the imaging lens 110 consists of six individual elements and are configured to reimage the array of fibers 106 in the FA direction at a magnification of 1×. It is contemplated that the magnification may be configured to provide a desirable line width and length at the work surface 112. In one embodiment, the line length in the SA direction may be between about 5 mm and about 10 mm in length, such as about 8 mm in length.

A first element 602 is spaced from the plurality of second elements 604. The first element 602 is disposed proximate the cylindrical microlens array 108 and is configured to prevent excessive divergence of light propagating through the first element 602. The imaging lens 110 is telecentric in object and image space. The imaging lens 110 is disposed within a distance 606 between the distal ends 107 of the fibers 106 and the work surface 112. The distance 106 may be between about 150 mm and about 200 mm, such as between about 165 mm and about 185 mm, such as about 170 mm. It is contemplated that the distance 606 may be larger or smaller depending on the desired thermal processing application and the type and arrangement of lenses and field stops utilized in the optical system 600.

FIG. 7A illustrates a schematic, plan view of a thermal processing apparatus. In one embodiment, the apparatus 700 is an anomorphic optical system configured to generate a line image at the work surface 112. The apparatus 700 comprises the fiber coupled laser diode array 102, the lens 502, the cylindrical microlens array 108, and the lens 504. In this embodiment, neither lens 502 nor lens 504 are considered imaging or reimaging lenses individually. Rather, the image of the fiber coupled laser diode array 102 is formed by the lenses 502, 504 together as a pair. The elements of the apparatus 700 are positioned such that light propagating from the distal ends 107 of the fibers 106 travels through, in this order, the lens 502, the cylindrical microlens array 108, and the lens 504. The line image formed at the work surface 112 has a uniform irradiance with a half-Gaussian or similar edge roll-off profile 701, which is determined, at least in part, by the refractive properties of the cylindrical microlens array 108.

The lens 502 has a first focal length $f_1$ and the lens 504 has a second focal length $f_2$. In one embodiment, the first focal length $f_1$ is between about 50 mm and about 150 mm, such as about 100 mm. The second focal length $f_2$ is between about 25 mm and about 75 mm, such as about 50 mm. The lens 502 and the lens 504 are separated by a distance defined by $f_1+f_2$. For example, the lens 502 and the lens 504 are about 150 mm apart. The lens 502 and the lens 504 each consist of multiple lens elements, however, it is contemplated that a single lens may be utilized. For example, a first single lens having the first focal length $f_1$ and a second single lens having the second focal length $f_2$ may be utilized as the lens 502 and the lens 504, respectively.

The cylindrical microlens array 108 is positioned between the lens 502 and the lens 504. For example, the cylindrical microlens array 108 is positioned at the first focal length $f_1$ of the lens 502. In one embodiment, the cylindrical microlens array 108 is a single array of cylindrical lenslets. In another embodiment, multiple cylindrical microlens arrays 108 are positioned adjacent to one another at a focal plane (defined by the first focal length $f_1$ from the lens 502) of the lens 502. In this embodiment, the cylindrical microlens arrays are closely spaced, such as being spaced apart by less than about 5 mm. The axes of the lenslets of the cylindrical microlens array 108 are parallel to the FA. Thus, the cylindrical microlens array 108 has a zero optical power in the FA direction. In the SA direction, each lenslet of the cylindrical microlens array 108 exhibits an optical power characterized by a numerical aperture $NA_{array}$.

In the FA direction, the lens 502 and the lens 504 form an image of the fiber coupled laser diode array 102 at the work surface 112 having a magnification defined by the relationship of $f_2/f_1$. In the SA direction, the cylindrical microlens array 108 and the lens 504 form a line image at the work surface 112 having a length defined by the relationship $2 \times NA_{array} \times f_2$.

In one example, the apparatus 700 has the following component values: $f_1=100$ mm, $f_2=50$ mm, and $NA_{array}=0.1$. A length 704 of the fiber coupled laser diode array 102 is between about 5 mm and about 15 mm, such as about 10 mm, and a core diameter of each fiber 106 is between about 50 µm and about 150 µm, such as about 100 µm. The line image formed at the work surface 112 has a length $2 \times NA_{array} \times f_2 = 10$ mm in the SA direction. As a result, the line image width at the work surface 112 in the FA direction is about 50 µm, which is defined by the relationship $100 \times (f_2/f_1)$. The irradiance profile 701 at the work surface 112 is uniform with a half-Gaussian or similar shape in the edge roll-off.

FIG. 7B is a schematic, side view of the apparatus 700 of FIG. 7A. FIG. 7B depicts the propagation of the laser energy in the FA direction, i.e., perpendicular to the fiber array. In the FA direction, the distal ends 107 of the fibers 106 are re-imaged, or reproduced, on the work surface 112. As such, the cylindrical microlens array 108 has no defocusing affect in the FA direction.

FIG. 8 is a schematic, plan view of a thermal processing apparatus 800. FIG. 8 depicts the SA direction of the light propagation. A first portion 808 of the apparatus 800 is similar to the apparatus 700 described with regard to FIG. 7A. As such, the cylindrical microlens array 108 is positioned at a focal plane 802 of the lens 502. A second portion 810 of the apparatus 800 includes a field stop 506 and a second lens 804. In one embodiment, the lens 502, lens 504, and the second lens 804 are similar but differ in their placement of the apparatus 800.

The lens 504 is positioned subsequent to the cylindrical microlens array 108 along the propagation path of the laser energy and the field stop 506 is positioned at a focal plane 806 of the lens 504. The field stop 506 truncates at least a portion of the laser energy present at the focal plane 806. The second lens 804 is positioned between the field stop 506 and the work surface 112.

The apparatus 800 creates an irradiance profile 801 at the work surface 112 having a reduced edge roll-off due to the truncation of the line image by the field stop 506. Similar to the irradiance profiles 401, 501 of FIG. 4 and FIG. 5, respectively, the line image profile at the work surface 112 makes the transition from maximum irradiance to zero irradiance over a distance of less than about 10 um (as determined by the resolution of the reimaging lense 804). Thus, the edge roll-off of the irradiance profile 801 is very steep and non-Gaussian.

In summation, the disclosed apparatuses utilize fiber coupled laser diode arrays which can be located remotely from a process chamber where a substrate is being thermally processed. The architecture of the apparatuses enable replacement of individual laser diodes while reducing system down time. Incorporating a field stop sharpens the line edge of the irradiance profile. Also, the field stop may be utilized to vary the line length to meet various processing requirements. The optical systems, comprising the cylindrical lenses and the imaging and/or reimaging lenses, form an anomorphic optical system and the line image provided to a work surface may have a uniform irradiance profile.

While the foregoing is directed to embodiments of the present invention, other and further embodiments of the invention may be devised without departing from the basic scope thereof, and the scope thereof is determined by the claims that follow.

The invention claimed is:

1. An apparatus for processing a substrate, comprising:
    a plurality of laser diodes;
    a plurality of fibers optically coupled to the plurality of laser diodes, and wherein a distal end of each of the fibers is spaced between 0.1 mm and 1.0 mm from each adjacent fiber, the distal ends of the fibers positioned within a single plane to within 20 µm or less;
    a first lens disposed proximate a distal end of the plurality of fibers, wherein the first lens is a cylindrical microlens array, wherein the first lens defocuses light propagating from the distal ends of the plurality of fibers in a direction parallel to a line which passes through all distal ends of the fibers of the plurality of fibers; and
    a second lens disposed proximate the first lens and configured to focus light propagating from the distal ends of the fibers, wherein the second lens reimages the light propagating from the distal ends of the fibers into a line image onto a work surface at a magnification of 1× in a direction perpendicular to a line which passes through all distal ends of the fibers of the plurality of fibers after defocusing by the first lens, wherein the line image is reproduced in a direction parallel to the direction of the propagation of light through the distal ends of the fibers of the plurality of fibers, and wherein the first lens and second lens form an anamorphic optical imaging system.

2. The apparatus of claim 1, wherein the fibers at the distal end of the plurality of fibers are disposed in a v-groove positioning element.

3. The apparatus of claim 1, wherein the distal ends of the fibers are positioned within a single plane.

4. The apparatus of claim 1, wherein each lens of the cylindrical microlens array is optically coupled to an individual fiber of the plurality of fibers.

5. The apparatus of claim 1, wherein an image plane of the first lens is located between 5 mm and 6 mm from the distal end of the fibers.

6. The apparatus of claim 5, wherein the first lens is disposed between the distal end of the fibers and the image plane.

7. The apparatus of claim 1, wherein a field stop is disposed between the first lens and the second lens.

8. The apparatus of claim 7, wherein a surface of the field stop facing the second lens is roughened or coated with an optically absorptive coating.

9. The apparatus of claim 7, wherein the field stop is disposed within an image plane of the first lens, the image plane located between 5 mm and 6 mm from the distal ends of the fibers.

10. The apparatus of claim 1, further comprising a field stop and a third lens, the field stop disposed between the second lens and the third lens.

11. An apparatus for processing a substrate, comprising:
    a plurality of laser diodes;
    a plurality of fibers optically coupled to the plurality of laser diodes, and wherein a distal end of each of the fibers is spaced between 0.1 mm and 1.0 mm from each adjacent fiber, the distal ends of the fibers positioned within a single plane;

a first lens disposed proximate a distal end of the plurality of fibers, wherein the first lens is a cylindrical microlens array having a plurality of cylindrical lenses, each cylindrical lens of the microlens array optically coupled to an individual fiber of the plurality of fibers, wherein the first lens defocuses light propagating from the distal ends of the fibers in a direction parallel to a line which passes through all distal ends of the fibers of the plurality of fibers;

a second lens disposed proximate the first lens and configured to focus light propagating from the distal ends of the fibers, wherein the second lens reimages the light propagating from the distal ends of the fibers into a line image onto a work surface at a magnification of 1× in a direction perpendicular to a line which passes through all distal ends of the fibers of the plurality of fibers, wherein the line image is reproduced in a direction parallel to the direction of the propagation of light through the distal ends of the fibers of the plurality of fibers, after defocusing by the first lens;

a field stop disposed proximate the second lens; and a third lens disposed between the field stop and the work surface, wherein the first lens, second lens, and third lens form an anamorphic optical imaging system.

12. The apparatus of claim 11, wherein the field stop truncates a portion of the light propagating from the reimaged distal ends of the fibers.

13. An apparatus for processing a substrate, comprising:

a plurality of fiber coupled laser diodes, wherein each fiber coupled laser diode comprises an individually controllable laser diode and is fiber optically coupled to the laser diode, and wherein a distal end of each of the fibers is spaced between 0.1 mm and 1.0 mm from each adjacent fiber, the distal ends of the fibers positioned within a single plane;

a cylindrical microlens array disposed between an image plane and the distal ends of the fibers of the fiber coupled laser diodes, wherein each cylindrical lens of the microlens array is optically coupled to an individual fiber of the plurality of fiber coupled laser diodes, wherein the cylindrical microlens array defocuses light propagating from the distal ends of the fibers in a direction parallel to a line which passes through all distal ends of the fibers of the plurality of fibers, and wherein the image plane is located between 5 mm and 6 mm from the distal ends of the fibers of the fiber coupled laser diodes; and a first lens disposed proximate the cylindrical microlens array and configured to focus light propagating from the distal ends of the fibers of the fiber coupled laser diodes, wherein the first lens reimages the light propagating from the distal ends of the fibers into a line image onto a work surface at a magnification of 1× in a direction perpendicular to a line which passes through all distal ends of the fibers of the plurality of fibers after defocusing by the cylindrical microlens array, wherein the line image is reproduced in a direction parallel to the direction of the propagation of light through the distal ends of the fibers of the plurality of fibers, wherein the cylindrical microlens array and the first lens form an anamorphic optical imaging system.

14. The apparatus of claim 13, further comprising a second lens disposed proximate the first lens, wherein a field stop is disposed between the first lens and the second lens.

* * * * *